United States Patent [19]
Riebman

[11] Patent Number: 5,118,660
[45] Date of Patent: Jun. 2, 1992

[54] SUPERCONDUCTING LOW-NOISE OSCILLATOR

[75] Inventor: Leon Riebman, Rydal, Pa.

[73] Assignee: American Electronic Laboratories, Inc., Lansdale, Pa.

[21] Appl. No.: 658,285

[22] Filed: Feb. 20, 1991

[51] Int. Cl.[5] .......................... H03B 5/00; H03B 5/18; H01B 12/00; H01L 39/12

[52] U.S. Cl. ........................... 505/1; 505/854; 331/96; 331/107 S; 331/117 D

[58] Field of Search ............. 331/69, 74, 96, 107 DP, 331/107 SL, 107 S, 109, 117 FE, 117 D, 117 R, 167; 505/1, 853, 854

[56] References Cited

U.S. PATENT DOCUMENTS

| | | | |
|---|---|---|---|
| 2,704,431 | 3/1955 | Steele | 58/24 |
| 3,316,499 | 4/1967 | Zinn et al. | 331/70 |
| 3,617,924 | 11/1971 | Fujita et al. | 331/70 |
| 4,749,963 | 6/1988 | Makimoto et al. | 331/117 D |
| 4,797,614 | 1/1989 | Nelson | 324/236 |
| 4,901,038 | 2/1990 | Dusclaux et al. | 331/167 |

*Primary Examiner*—David Mis
*Attorney, Agent, or Firm*—Seidel, Gonda, Lavorgna & Monaco

[57] ABSTRACT

A low-noise cryogenic oscillator has a resonant circuit formed of superconducting material for generating a signal at a desired frequency. A linear amplifier and a limiter are electrically connected to the resonant circuit at first, second and third locations. A buffer amplifier is electrically connected to the resonant circuit at a fourth location and applies the signal generated by the resonant circuit to a load. The first, second, third and fourth locations are selected to minimize the impedance from those locations to ground at 1/f frequencies. The resonant circuit, the linear amplifier, the limiter and the buffer amplifier are all maintained at a temperature below the critical temperature of the superconducting material.

9 Claims, 1 Drawing Sheet

SUPERCONDUCTING LOW-NOISE OSCILLATOR

FIELD OF THE INVENTION

The present invention relates to an oscillator including a superconducting resonator which has low noise, in particular low phase noise, in the vicinity of its center frequency.

BACKGROUND OF THE INVENTION

A typical oscillator comprises a resonator (usually, but not always an inductor and a capacitor), an amplifier, a limiter and a load. The resonator is driven by the amplifier, which supplies the resonator with energy. Part of the energy in the resonator is applied to the input of the amplifier through a feedback circuit in order to keep the resonator in oscillation. The resonator and the amplifier thus form a closed loop The rest of the energy is applied to the load, for useful work.

The output of the amplifier is greater than the sum of the power dissipated in the resonator, the power applied to the amplifier, and the power applied to the load. This is because all oscillators require a loop gain greater than unity in order to operate. An oscillator will not function if, at the oscillator frequency, the magnitude of the product of the gain of the amplifier and the feedback factor of the feedback circuit is less than unity. If the loop gain is less than unity, the oscillations will decay to zero. In theory, the oscillator will operate if the loop gain is exactly equal to one, the so-called Barkhausen condition. However, as a practical matter, an oscillator in which the loop gain is exactly unity is an abstraction which is completely unrealizable in practice. Therefore, a practical oscillator always has a loop gain slightly larger than one to ensure that, with incidental yet inevitable variations in circuit parameters, the loop gain does not fall below unity.

Of course, with a loop gain greater than unity, a signal of one volt, for example, appearing initially at the input will, after a trip around the loop, appear at the input as a signal larger than one volt. After another trip around the loop, this larger signal will become still larger, and so on. The amplitude of the oscillator output will therefore continue to increase unless it is limited, either by a discrete limiting circuit or by non-linearities (either inherent or intentionally introduced) in the amplifier or the resonator themselves.

An example of an oscillator in which non-linearities in the resonator are relied on to limit the oscillations is disclosed in U.S. Pat. No. 4,901,038. However, that patent recognizes that the non-linear resonator introduces noise into the oscillator. In particular, low frequency noise in the resonator is converted to high-frequency noise, in particular phase noise. To minimize noise introduced by the non-linear resonator, it is composed of superconducting elements kept at cryogenic temperatures.

There are other noise sources, however, which U.S. Pat. No. 4,901,038 does not take into account and, therefore, does not suggest how to eliminate. There is residual Johnson noise (i.e., thermal noise) even at cryogenic temperatures, and possibly granular noise, in the resonator, which results in noise energy across the spectrum from DC to well above the resonator frequency. In addition, the input circuit to the linear amplifier feeds back both 1/f noise and Johnson noise to the resonator. The 1/f noise is inherent in active semiconductor devices. Below a certain frequency, perhaps 1 MHz, noise usually increases with decreasing frequency, approximately proportional to 1/f. This 1/f noise is usually attributed to surface conduction and modulation effects in the semiconductor device. In the medium frequency range, the noise figure is constant and lowest for a given device. At higher frequencies, the noise begins to increase again with frequency. Moreover, even a good "linear" amplifier will have some residual non-linearity which frequency-mixes, or beats with, any noise energy coming into the amplifier. The load also feeds back Johnson noise to the resonator. To provide power to an output load requires more energy (i.e., higher gain) from the linear amplifier, which requires additional amplifier current which, in turn, produces more noise. Finally, a separate limiter introduces noise due to its limiting action. This can include both 1/f noise and broadband Johnson noise.

All of these noise sources are known to contribute to both amplitude noise (in phase with the oscillator signal) and phase noise (out of phase with the oscillator signal). Phase noise is especially detrimental, in that it introduces spurious frequency components which limit the usefulness of the oscillator in many applications.

It is therefore one object of the invention to provide an oscillator which provides a minimum of noise fed back into the resonator, which, in turn, provides an oscillator with extremely low noise and, in particular, low phase noise in the vicinity of the oscillator center frequency.

SUMMARY OF THE INVENTION

The present invention is a low-noise cryogenic oscillator comprising resonant circuit means formed of superconducting material for generating a signal at a desired frequency, linear amplifier means electrically connected to the resonant circuit means at first and second locations thereon, limiter means electrically connected to the resonant circuit means at a third location thereon, and buffer amplifier means for applying the signal generated by the resonant circuit means to a load and electrically connected to the resonant circuit means at a fourth location thereon. The first, second, third and fourth locations are selected to minimize impedance at 1/f frequencies from the locations to electrical ground and to minimize Johnson noise into the resonant circuit. The resonant circuit means, linear amplifier means, limiter means and buffer amplifier means are all maintained at a temperature below the critical temperature of said superconducting material.

BRIEF DESCRIPTION OF THE DRAWINGS

For the purpose of illustrating the invention, there is shown in the drawings a form which is presently preferred; it being understood, however, that this invention is not limited to the precise arrangements and instrumentalities shown.

DESCRIPTION OF THE INVENTION

Figure 1:
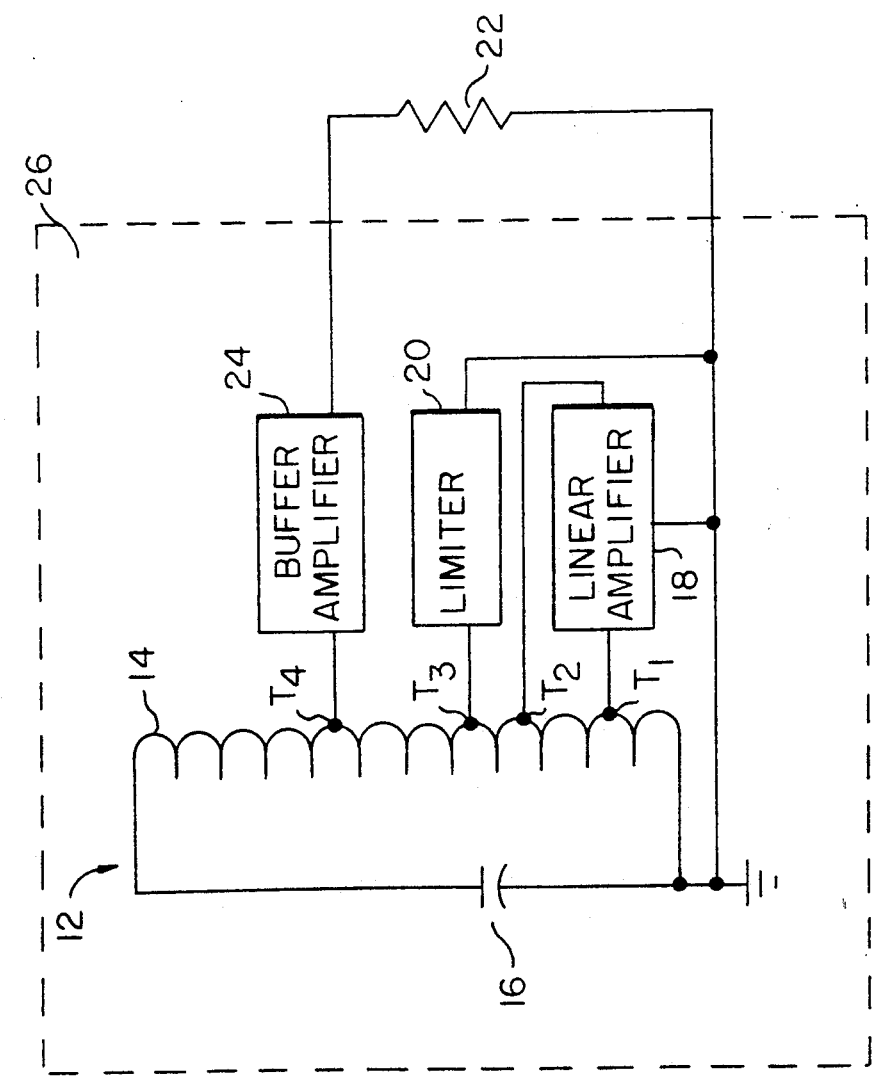
FIG. 1 is a simplified schematic diagram of an oscillator according to the present invention.

Referring now to the drawings, wherein like numerals indicate like elements, there is shown in FIG. 1 a simplified schematic diagram of an oscillator 10 according to the invention. Oscillator 10 comprises a resonator 12, which is illustrated as an LC tank circuit composed of an inductor 14 and a capacitor 16. Although resonator 12 is shown as an LC tank circuit, it should be understood that any other type of resonator, such as a tuned cavity resonator, can be used without departing from the scope of the invention. However, it is preferred that, whatever form of resonator is used, the resonator be composed of superconducting material, preferably but not necessarily a thin-film superconductor.

A linear amplifier 18 is connected to and supplies energy to resonator 12. Linear amplifier is constrained to operate in its linear range to avoid introducing noise due to non-linear mixing into oscillator 10. By keeping linear amplifier 18 within its linear range, the effects of residual non-linearity (which result in frequency-mixing noise energy coming into the linear amplifier) are minimized.

The oscillator is stabilized by a limiter 20, which could, but not necessarily, be composed of a pair of anti-parallel diodes. Limiting may also be achieved by designing the resonator 12 to become non-linear and begin overloading at a specific circuit voltage.

It can be seen from FIG. 1 that a portion of the energy of resonator 12 is applied to linear amplifier 18, where it is amplified and fed back to resonator 12. A portion of the energy is provided to limiter 20 and the remaining portion of the energy of resonator 12 is applied to a load 22, where it can be put to a desired use, such as a carrier for a modulator, a frequency reference, and so forth. Resonator 12 is isolated from load 22 by a buffer amplifier 24, to minimize noise feedback from the load and to minimize current loading of the resonator. It will be appreciated that a large load current demand on the resonator will require a greater current output from linear amplifier 18 which, in turn, tends to increase the noise introduced into oscillator 10.

To minimize noise still further, from all the various noise sources, not only resonator 12 but linear amplifier 18, limiter 20 and buffer amplifier 24 are all maintained at cryogenic temperatures. For example, all of these circuit elements can be kept in a cryostat 26, as indicated by the dashed line in FIG. 1. Thus, the entire oscillator, not just superconducting resonator 12, is maintained at a temperature of 90 degrees Kelvin or less, which is the critical temperature for a typical high-temperature-superconductors. Oscillator 12 can be immersed in liquid nitrogen, for example, which is at a temperature of 73 degrees Kelvin, well below the critical temperature of a typical superconducting resonator.

As shown in FIG. 1, linear amplifier 18, limiter 20 and buffer amplifier 24 are all connected to coil 14 of resonator 12 at respective tap points $T_1$ through $T_4$. Although $T_1$, $T_2$, $T_3$ and $T_4$ are shown in order of increasing distance from electrical ground, they need not be in that order, and may be located anywhere along coil 14 consistent with minimizing noise, as discussed below.

Linear amplifier 18 is designed so that the noise that it introduces from its input circuit to the resonator is minimized, and so that the noise from the feedback circuit is also minimum. To accomplish this for a given linear amplifier, it is important to find the proper locations for the tap points on the resonator so that both the input to the amplifier and the output of the amplifier are optimized for minimum contribution to the noise circuit. Recognizing that both sources of noise contribution from the linear amplifier (the amplifier input circuit and the feedback circuit) contain 1/f noise, it becomes important to minimize the impedance to ground for both these respective tap points at frequencies (referred to herein as "1/f frequencies") at which 1/f noise is likely to be significant.

Figure 2:
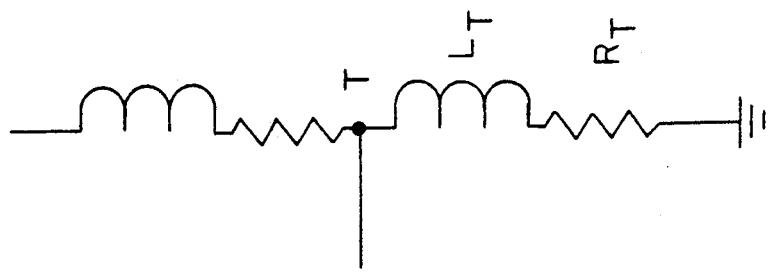
FIG. 2 is a simplified schematic representation of an equivalent circuit of a portion of the oscillator of FIG. 1.

Referring now to FIG. 2, the impedance to ground from a given tap point is schematically illustrated as a discrete inductor $L_T$ in series with a discrete resistor $R_T$, connected between the tap point T and ground. Inductor $L_T$ represents the inductive component attributable to that portion of coil 14 which is physically and electrically between tap point T and ground, and resistor $R_T$ represents the resistive component of that portion of coil 14. The impedance between tap point T and ground at 1/f frequencies is expressed quite accurately by the equation $$Z \approx (R_T^2 + w^2 L_T^2)^{\frac{1}{2}} \qquad (1)$$

where $R_T$ is the resistance to ground and $wL_T$ is the inductive reactance to ground at 1/f frequencies. Both $R_T$ and $L_T$ for a superconductor can vary significantly at 1/f frequencies when compared to their values at oscillator frequency.

To minimize the impedance Z, it is desirable not only to minimize $R_T$ at the 1/f frequencies, but also to use the maximum value of capacitance of capacitor 16 to minimize the inductance of coil 14 consistent with maintaining maximum Q for the resonator. In general, the Q, or "quality factor," of an LC tank circuit is given by $$Q = 1/R \, [(L/C)^{\frac{1}{2}}] \qquad (2)$$

where L is the inductive reactance, C is the capacitive reactance, and R is the effective resistance of the tank circuit. It can be seen from equation (2) that Q can also be increased by decreasing the effective resistance R.

$R_T$ can be minimized for a superconducting resonator by making the thickness of the superconducting thin film as thick as feasible. It is not yet known with certainty whether, for thin-film superconductors, the maximum current penetration depth is greater at very low frequencies (where 1/f noise is most problematic) than at higher frequencies, where oscillator 10 is expected to operate. If it is, the thickness of the superconducting thin film can be chosen to be as thick as practical in order to minimize its resistance at the 1/f frequencies, where current penetration depths may be greatest. Thus, by locating the tap points as close to ground as possible, and by selecting the capacitance value of capacitor 16 and the thickness of the superconducting film for minimum impedance at 1/f frequencies, the amount of 1/f noise input to the oscillator is greatly reduced.

Likewise, the buffer amplifier input should be located at a tap point on coil 14 to optimize the following conditions: minimizing the impedance at 1/f frequencies between the input of the buffer amplifier and ground, minimize both the resistive loading of the tank circuit and the noise input to the tank circuit from the buffer amplifier, and keep the noise power added to the useful power passed to the load to be relatively negligible. The exact tap point may readily be located empirically.

Further, as already noted, noise contributed to the oscillator in the form of Johnson noise is minimized by maintaining not only the superconducting resonator 12 at cryogenic temperatures, but by keeping linear amplifier 18, limiter 20 and buffer amplifier 24 at cryogenic temperatures as well.

It will be appreciated that the present invention provides a novel and unobvious oscillator circuit which eliminates or greatly reduces sources of noise from a variety of sources, and which is therefore free from the problems associated with noisy oscillators.

The present invention may be embodied in other specific forms without departing from the spirit or essential attributes thereof and, accordingly, reference should be made to the appended claims, rather than to the foregoing specification, as indicating the scope of the invention.

I claim:

1. A cryogenic oscillator having low phase noise and low 1/f noise, comprising
   (a) resonant circuit means formed of superconducting material for generating a signal at a desired frequency,
   (b) linear amplifier means electrically connected to the resonant circuit means at first and second locations thereon,
   (c) limiter means electrically connected to the resonant circuit means at a third location thereon, and
   (d) buffer amplifier means for applying the signal generated by the resonant circuit means to a load and electrically connected to the resonant circuit means at a fourth location thereon,
   said first, second, third and fourth locations being selected to minimize impedance from said locations to electrical ground at frequencies at which substantial 1/f noise is present and to minimize resistive loading of the resonant circuit means and noise input to the resonant circuit means from the buffer amplifier, said resonant circuit means, linear amplifier means, limiter means and buffer amplifier means all being maintained at a temperature below the critical temperature of said superconducting material.

2. An oscillator according to claim 1, wherein the resonant circuit means comprises a superconducting cavity.

3. An oscillator according to claim 1, wherein the resonant circuit means comprises an inductor means and capacitor means composed of thin-film superconducting material.

4. An oscillator according to claim 3, wherein the thickness of the thin-film superconducting material is substantially greater than the penetration depth of the material at said desired frequency.

5. An oscillator according to claim 3, wherein the inductance of the inductor means and the capacitance of the capacitor means are chosen to yield a desired Q for the resonant circuit means at a minimum value of inductance.

6. An oscillator according to claim 5, wherein the thickness of the thin-film superconducting material comprising the inductor means has a thickness substantially greater than the penetration depth of the material at the desired oscillator frequency.

7. An oscillator according to claim 6, wherein the thickness of the superconducting material, the inductance of the inductor and the capacitance of the capacitor are all chosen to yield the desired Q at a minimum value of impedance from said first, second, third and fourth locations to electrical ground.

8. Method of minimizing phase noise and 1/f noise in an oscillator circuit of the type having a resonant circuit driving a load and at least a linear amplifier connected to the resonant circuit defining a closed loop having a loop gain greater than unity, and having a limiter for stabilizing the oscillator, comprising the steps of:
   (a) connecting between the resonant circuit and the load a buffer amplifier for providing current to the load while minimizing current drawn from the resonant circuit, and
   (b) connecting the linear amplifier and the buffer amplifier to the resonant circuit at locations of minimum impedance from said locations to electrical ground at frequencies at which substantial 1/f noise is present.

9. Method according to claim 8, further comprising the step of minimizing impedance from said locations to electrical ground by minimizing both resistance and inductive reactance from said locations to ground at said 1/f frequencies.

* * * * *